INVENTOR
PAUL L. FLEMING

BY Stephen J. Limanek
ATTORNEY 3,293,447

PARAMETRIC TUNNEL-DIODE AMPLIFIER FREQUENCY CONVERTER USING PUMP HARMONIC

Paul L. Fleming, Brewster, N.Y., assignor to International Business Machines Corporation, New York, N.Y., a corporation of New York Filed Apr. 10, 1963, Ser. No. 271,899
7 Claims. (Cl. 307—88.3)

Figure 1:
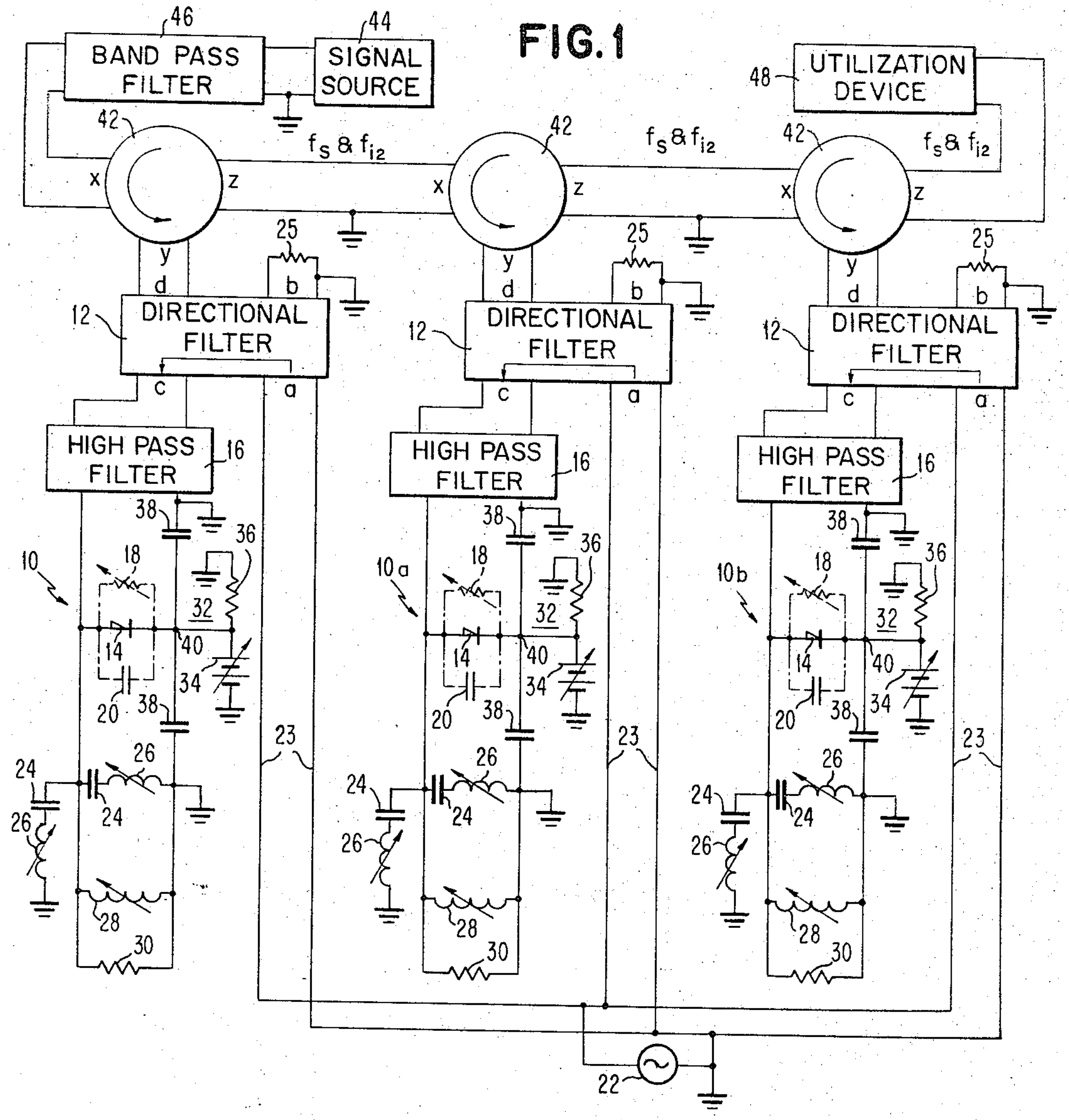

This invention relates to frequency converters and more particularly to solid-state frequency converters providing gain and capable of up conversion as well as down conversion.

Solid-state circuits are known which translate signals from a given frequency to a lower frequency with a conversion gain or to a higher frequency with conversion gain. However, these prior art circuits consume a relatively large amount of pumping power in order to provide a given amount of gain.

It is an object of this invention to provide an improved solid-state frequency converter.

Another object of this invention is to provide an improved frequency converter which provides up conversion while utilizing a very small amount of pumping power.

Still another object of this invention is to provide an improved non-linear conductance frequency up converter using an idler circuit.

A further object of this invention is to provide an improved non-linear conductance frequency up converter exhibiting power gains.

Still another object of this invention is to provide improved frequency up converters utilizing non-linear negative conductance devices.

Yet another object of this invention is to provide an improved solid-state repeater.

Yet a further object of this invention is to provide an improved repeater having a cascaded arrangement of non-linear negative conductance frequency converters providing power gain at more than one frequency.

Still a further object of this invention is to provide an improved solid-state amplifying frequency converter and signal amplifier.

In accordance with this invention a frequency converter is provided which includes a non-linear negative conductance device, such as a tunnel diode, biased in its positive resistance region, to which a local oscillator or pump is coupled, the device having a negative second harmonic conversion conductance over an operational pumping range.

In accordance with another aspect of this invention, by cascading a plurality of the frequency converter stages both an input signal and a sideband signal of at least a second harmonic of a pump frequency are highly amplified to form a very efficient repeater, and either or both of these signals may be utilized at the output of the repeater.

An important advantage of this invention is that frequency up and down conversion with gain is provided very simply and economically.

An important feature of this invention is that a strong lower sideband voltage of the second harmonic of the pump frequency is provided.

The foregoing and other objects, features and advantages of the invention will be apparent from the following more particular description of a preferred embodiment of the invention, as illustrated in the accompanying drawings.

Figure 2:
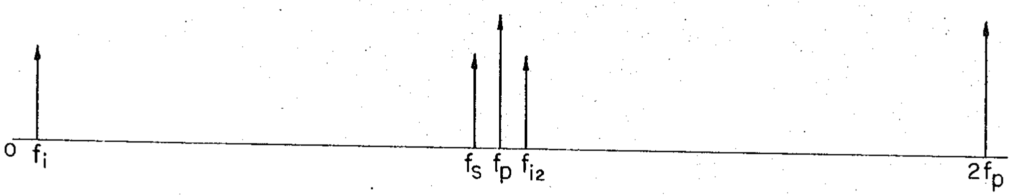
Figure 3:
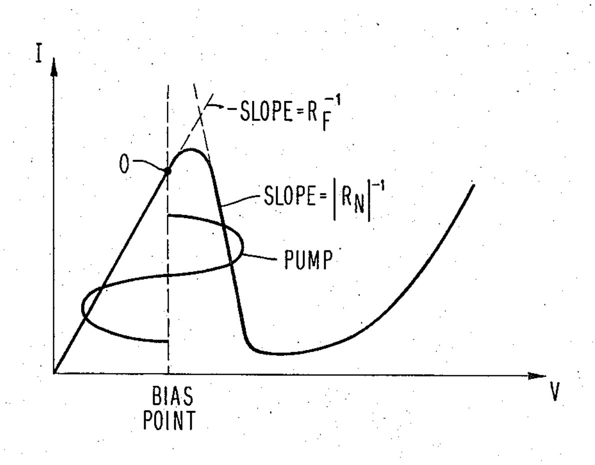
Figure 4:
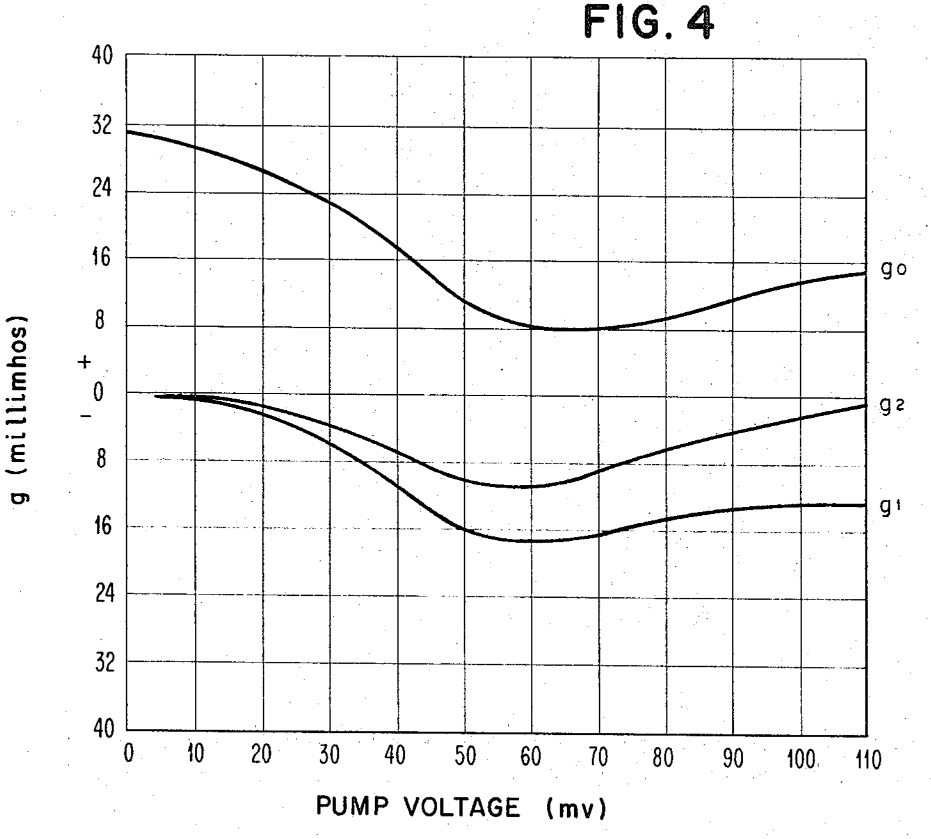

In the drawings:

FIG. 1 illustrates a plurality of frequency converter stages of the present invention connected in a cascade arrangement, FIG. 2 is an indication of the frequency spectrum of signals employed in the stages illustrated in FIG. 1, FIG. 3 is an I–V characteristic curve of the type obtained from each of the non-linear conductive devices used in each of the stages shown in FIG. 1 and FIG. 4 is a graph showing the variation of pumping parameters with pump voltage magnitude for the devices used in the stages illustrated in FIG. 1.

Referring to the drawing in more detail, there is shown in FIG. 1 a repeater comprising a plurality of frequency converter stages 10, 10*a* and 10*b*. Each of these stages includes a directional filter 12, which may be a conventional four-port directional filter, having ports *a, b, c* and *d*. A non-linear negative conductance device, preferably, a tunnel diode 14 of a type to be described hereinbelow in more detail, is coupled to port *c* of the directional filter 12 through a high pass filter 16. The effective equivalent circuit of the tunnel diode 14 is indicated in phantom as a non-linear resistance 18 to which is parallelly connected a capacitor 20. The capacitance value of the capacitor 20 may be considered as being constant in the range of frequencies employed in the repeater. The parasitic inductance and resistance serially connected to the non-linear resistance of the equivalent circuit of the diode may be regarded as being negligible for the purpose of the present invention and, therefore, is not indicated in the drawing. A common pump voltage source or local oscillator 22 is connected across the tunnel diode 14 through the directional filter 12, which is tuned to the frequency of the pump voltage, and the high pass filter 16, the pumping voltage source 22 being directly connected to port *a* of the directional filter 12 by a transmission line 23. The port *b* of the directional filter 12 is terminated in an impedance 25 which is equal to the characteristic impedance of the directional filter 12.

A pair of series circuits each including a capacitor 24 and a first variable inductor 26 is connected across the tunnel diode 14. Connected also across the tunnel diode 14, is a second variable inductor 28. A resistor 30, which may act as an idler load, as will be explained hereinbelow, is shown connected in parallel with the second variable inductor 28. The resistor 30 may be a separate resistance element or it may represent the resistance of the second variable inductor 28 which is present in practical inductors. A bias means 32 is also provided which includes an adjustable voltage source 34 connected across a resistor 36 and a circuit including the tunnel diode 14 serially connected with the second variable inductor 28. A pair of RF by-pass capacitors 38 are connected to a common point 40 located between the tunnel diode 14 and the positive terminal of the voltage source 34 so that point 40 is at substantially RF ground but not at D.C. ground. A circulator 42 which may be a conventional three-port circulator having an input port *x*, an output port *z* and an intermediate port *y* coupled to the port *d* of the directional filter 12 is provided for separating the input and output of each stage and also as a means for isolating impedance discontinuities.

A signal source 44 is coupled to the input port *x* of circulator 42 of this first stage 10 through a band pass filter 46, the output port *z* of the circulator 42 of the first stage 10 is connected to the input port *x* of the circulator 42 of the second stage 10*a* of the repeater, the output port *z* of the circulator 42 of the second stage 10*a* is connected to the input port *x* of circulator 42 of the third stage 10*b* and the output port *z* of the circulator 42 of the third stage 10*b* is connected to any suitable utilization device 48.

In FIG. 2 of the drawing there is indicated the relative frequencies of the signals or voltages passing through each of the stages 10, 10$a$ and 10$b$ of the repeater illustrated in FIG. 1. The frequency of the voltage from the common pump source 22 is indicated as $f_p$, the frequency of the signal source 44 is indicated as $f_s$ and the difference frequency between the pump frequency and the signal frequency, that is, the idler frequency, is indicated as $f_i$. There is also indicated in FIG. 2 of the drawing the frequency $2f_p$ which is the second harmonic of the pump frequency $f_p$. The lower sideband of the second harmonic $2f_p$ is shown as $f_{i2}$.

In the operation of the repeater of the present invention illustrated in FIG. 1 of the drawing, the signal voltage $f_s$ from the signal source 44 is applied through the band pass filter 46 to the input port $x$ of the circulator 42 of the first stage 10, passing out of the intermediate port $y$ of the circulator 42 through the directional filter 12 and high pass filter 16 to the tunnel diode 14. A circuit which includes the capacitor 20 of the tunnel diode 14 and the pair of parallelly arranged first inductors 26, having a combined relative inductance value substantially less than the inductance of the second inductor 28, is tuned to the signal frequency $f_s$. The second inductor 28 appears as an open circuit at the signal frequency and the pair of parallel capacitors 24 appears as a large capacitance at the signal frequency and, therefore, can be ignored. The pump voltage $f_p$ from the common pump voltage source 22 passes through the directional filter 12 and the high pass filter 16 to be applied also to the tunnel diode 14. Since the pump frequency $f_p$ has a frequency value relatively near that of the signal frequency $f_s$ as indicated in FIG. 2 of the drawing, the pump voltage also appears in the circuit including capacitor 20 and the pair of inductors 26 described hereinabove. The voltages $f_s$ and $f_p$ are mixed in the tunnel diode 14 to produce the idler signal $f_i$ of a relatively low frequency which is applied to an idler circuit including the pair of parallel capacitors 24, the second variable inductor 28 and the resistor 30, which is used to load the idler circuit. The inductance value of the pair of variable inductors 26 is relatively low compared to the value of the second variable inductor 28, as stated hereinabove, and therefore, at the idler frequency, the reactance of the inductors is negligible and, therefore, may be ignored.

In order to produce the lower sideband signal $f_{i2}$ of the second harmonic $2f_p$ of the pump frequency $f_p$, it has been found in accordance with this invention to utilize a tunnel diode capable of generating a relatively strong current at the frequency $2f_p$ in the tunnel diode 14. It has been further found in accordance with the present invention that this relatively strong current at the frequency $2f_p$ is produced in tunnel diodes which have a characteristic curve such that the slope of the negative resistance region is greater than the slope of the positive resistance region, as shown in FIG. 3 of the drawing. A tunnel diode having such a characteristic curve provides a conversion conductance at the frequency $2f_p$ which has negative values in a wide range of pump voltages, as indicated in FIG. 4 of the drawing by the curve $g_2$.

When the current at the frequency $2f_p$ is produced in the tunnel diode 14, the lower sideband voltage $f_{i2}$ of the frequency $2f_p$ is also produced due to the mixing of the frequencies $f_s$ and $2f_p/f_{i2}$, which frequency $f_{i2}$ also appears in the signal circuit including the capacitor 20 and the pair of parallelly arranged first inductors 26, since, as indicated in FIG. 2 of the drawing, the frequency $f_{i2}$ likewise is relatively near the frequency $f_s$. A voltage at the frequency $2f_p$ of any substantial magnitude does not appear in any of these stages since the common pump voltage source 22 is a low impedance at the frequency $2f_p$.

It can be seen that there appears in the first stage 10 of the repeater of FIG. 1, an idler voltage $f_i$, a signal voltage $f_s$, a pump voltage $f_p$ and a lower sideband voltage $f_{i2}$. The high pass filter 16 is designed to pass only the frequencies $f_s$, $f_p$ and $f_{i2}$, but since the directional filter 12 is tuned to the pump frequency $f_p$, only the voltages $f_s$ and $f_{i2}$ pass from port $c$ through the directional filter 12 to port $d$ thereof and to the intermediate port $y$ of the circulator 42, thereafter appearing at the output port $z$ of the circulator 42.

The output voltages $f_s$ and $f_{i2}$ from the output of the first stage 10 are applied to the input port $x$ of the circulator 42 of the second stage 10$a$ and pass from the intermediate port $y$ through the directional filter 12 and the high pass filter 16 to the tunnel diode 14 of the second stage 10$a$. In the second stage 10$a$ the signal voltage $f_s$ and the pump voltage $f_p$ are mixed in the non-linear negative conductance element or tunnel diode 14 in very much the same manner as described in connection with the operation of the first stage 10. The circuitry of the second stage 10$a$ is similar to the circuitry of the first stage 10 and, therefore, the elements in the second stage 10$a$ have the same reference numerals as the corresponding elements in stage 10. The output voltages $f_s$ and $f_{i2}$ from the output port $z$ of the circulator 42 of the second stage 10$a$ are applied to the input port $x$ of the circulator 42 of the third stage wherein the pump voltage $f_p$ and signal voltage $f_s$ are mixed, producing voltages $f_s$ and $f_{i2}$ at the output port $z$ of the circulator 42 of the third stage 10$b$ in the manner described in connection with the operation of stage 10 and 10$a$. The circuitry of the third stage 10$b$ is also similar to the circuitry of the first stage 10 and, therefore, the elements thereof have the same reference numerals as the corresponding elements in stage 10.

The output voltage from the output port $z$ of the circulator 42 of the third stage 10$b$ is applied to the utilization device 48. As shown in FIG. 1 of the drawing, both the signal voltage $f_s$ and the lower sideband voltage $f_{i2}$ are applied to the utilization device 48. However, it should be understood that conventional filters or a directional filter similar to the directional filter 12, may be coupled to the output port $z$ of circulator 42, or incorporated in utilization device 48, so as to separate the signal voltage $f_s$ and the lower sideband voltage $f_{i2}$ to apply each of these voltages to separate utilization means.

One of the circuits of the present invention which has operated successfully used a commercially available 2 milliampere germanium microwave tunnel diode for the tunnel diode 14 of FIG. 1 of the drawings in a strip line mount. This diode had a current-voltage characteristic curve similar to that illustrated in FIG. 3 of the drawing and was biased at point O in the positive resistance region of the I–V curve very near the peak thereof, as indicated in FIG. 3. The average value of the non-linear conductance of this diode as a function of pump voltage, at the bias indicated in FIG. 3 of the drawing, is indicated by the curve $g_0$ of FIG. 4 of the drawing and the conversion conductance at $f_p$ and at $2f_p$ is indicated by curves $g_1$ and $g_2$, respectively, where it can be seen that not only the values of $g_1$ but also those of $g_2$ are negative. The frequency of the signal voltage from signal source 44 was 1,950 megacycles in the successfully operated circuit and the frequency of the pump voltage from the common pump voltage source 22 was equal to 2,050 megacycles, thus producing an idler frequency of 100 megacycles and a lower sideband frequency $f_{i2}$ of 2,150 megacycles. The signal voltage gain of a stage was equal to 17.4 db, and the gain of the lower sideband voltage $f_{i2}$ was equal to 15.4 db with an approximate bandwidth of 5 megacycles. The pump power utilized from the common pump voltage source 22 was equal to approximately only 100 microwatts. The circuit of the present invention is, of course, not limited to the frequency values mentioned hereinabove. Any frequency or combination of frequencies may be used so long as they are below the cut-off frequency of the tunnel diode, the cut-off frequency being that frequency above which the diode negative conductance changes to a positive conductance.

On a small signal basis when the input to one of the stages such as, 10*a* or 10*b*, is at the signal frequency $f_s$ and at the lower sideband frequency $f_{i2}$, the output from the particular stage is of the form $(G_1+G_2)(\bar{f}_s+\bar{f}_{i2})$, where $\bar{f}_s$ represents unit power at $f_s$, $\bar{f}_{i2}$ represents unit power at $f_{i2}$, $G_1$ equals the signal power gain and $G_2$ equals the up conversion power gain as a result of linearity in the stage. It should be noted that when the insert to a stage is $f_s$ or $f_{i2}$ alone, the output from a stage is of the form $G_1\bar{f}_s+G_2\bar{f}_{i2}$ or $G_1\bar{f}_{i2}+G_2\bar{f}_s$, respectively. Thus, it can be seen that in accordance with an aspect of this invention gain enhancement at $f_s$ or $f_{i2}$ is obtained by merely applying both frequencies to the input of a stage. In the special case of $G_1=G_2$, this represents an added power gain of 3 db, or factor of 2, per stage.

As indicated above in connection with FIG. 3 of the drawing, the slope $|R_N|^{-1}$ of the negative resistance region of the I–V characteristic curve of the tunnel diode is steeper than the slope $R_F^{-1}$ of the positive resistance region containing the bias point O, i.e., $$\left|\frac{1}{R_N}\right|>\left|\frac{1}{R_F}\right|$$

This slope relationship is instrumental in producing the negative value of $g_2$ as shown in FIG. 4. With the slope relationships reversed, a positive value of $g_2$ would be obtained over the pumping range and the bias point indicated in FIG. 3. The I–V characteristic curve in FIG. 3 was measured for the 2 milliampere germanium microwave tunnel diode with an $I_p/C$ ratio of 0.5, where $I_p$=peak current in milliamperes and $C$=capacitance of the diode in picofarads.

In order to more clearly appreciate the significance of the present invention, it should be noted from the following relations how the production of a negative $g_2$ term produces higher gains for a given sideband loading and pumping power.

For the signal case:

$$\text{signal power gain}=\left[\frac{g_s-g_{in}}{g_s+g_{in}}\right]^2$$

where $g_s$=signal source conductance and $g_{in}$=input conductance of a converter stage at the signal frequency, or, more specifically, $$g_{in}=\frac{g_1^2(2g_2-2g_0-g_{i2})-(g_0+g_i)(g_2^2-g_0^2-g_0g_{i2})}{(g_0+g_{i2})(g_0+g_i)-g_1^2}$$

where $g_1$=conversion conductance at $f_p$
where $g_2$=conversion conductance at $2f_p$
where $g_0$=average conductance
where $g_i$=positive loading conductance at $f_i$
where $g_{i2}$=positive loading conductance at $f_{i2}$.

From the above, it can be seen that a negative $g_2$ value increases the negative value of $g_{in}$ which in turn increases the ratio in the signal gain expression for a given value of $g_s$.

For the $f_{i2}$ case:

$$f_{i2}\text{ power gain}=\frac{4g_{i2}g_s}{(g_{in}+g_s)^2}\left[\frac{(g_0+g_i)g_2-g_1^2}{g_1^2-(g_0+g_1)(g_{i2}+g_0)}\right]^2$$

From the above, it can be seen that the $f_{i2}$ gain expression is also enhanced by a negative $g_2$ value.

If the idler frequency $f_i$ is desired, i.e., for demodulation and data extraction purposes, it may be obtained from the idler circuit of any of the stages by suitably coupling to the corresponding idler circuit.

It should also be understood that the stages 10, 10*a* and 10*b* in the repeater can contain tunnel diodes 14 having staggered peak current values so as to handle the increasing signal levels as the voltages are applied from stage 10 to 10*a* and from 10*a* to 10*b*.

The tunnel diode used in the successfully operated circuit mentioned hereinabove has a maximum theoretical gain of 14 db as a negative resistance amplifier, with a characteristic impedance of 50 ohms, but under pumped conditions in this circuit, total power gain of 32.8 db was measured in a stage.

From the above description it can be seen that the circuit of the present invention can be used for data transmission and communication systems as a means of providing a high gain solid-state repeater directly at microwave frequencies with or without I-F output for demodulation and data extraction purposes, as well as for other applications, such as, regenerative receivers, satellite communications and modulation techniques.

Although as indicated hereinabove, the circuits of the present invention may be fabricated in strip line form other types of lines, such as, coaxial and waveguides may also be employed.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A frequency converter comprising,
a non-linear negative conductance device having a current-voltage characteristic including a positive resistance region and a negative resistance region forming a point of inflection, the slope of said negative resistance region being greater than that of said positive resistance region,
means for biasing said device in said positive resistance region in the vicinity of said point of inflection,
means for applying a pump voltage having a first frequency to said device,
means for applying a signal voltage having a second frequency to said device,
means for applying a voltage having a third frequency equal to the lower sideband of the second harmonic of said first frequency to said device, said second frequency being approximately equal to but less than said first frequency and said third frequency being approximately equal to but greater than said first frequency,
first circuit means tuned to substantially said first, second and third frequencies coupled to said device,
idler circuit means tuned to substantially a frequency equal to the difference between said first and second frequencies coupled to said device, and
energy extracting means coupled to said first circuit means for providing an output voltage having a frequency equal to one of said second and third frequencies.

2. A frequency converter as set forth in claim 1 wherein said non-linear negative conductance device is a tunnel diode.

3. A frequency converter comprising,
a non-linear negative conductance device having a current-voltage characteristic including a positive resistance region and a negative resistance region forming a point of inflection, the slope of said negative resistance region being greater than that of said positive resistance region,
means for biasing said device in said positive resistance region in the vicinity of said point of inflection,
means for applying a pump voltage having a first frequency to said device,
means for applying a signal voltage having a second frequency to said device whereby said device generates a voltage having a third frequency equal to the lower sideband of the second harmonic of said first frequency, said second frequency being approximately equal to but less than said first frequency, and said third frequency being approximately equal to but greater than said first frequency,
first circuit means tuned to substantially said first, second and third frequencies coupled to said device,
idler circuit means tuned to substantially a frequency equal to the difference between said first and second frequencies coupled to said device, and energy extracting means coupled to said first circuit means for providing an output voltage having a frequency equal to one of said second and third frequencies.

4. A frequency up converter comprising, a non-linear negative conductance device having a current-voltage characteristic including a positive resistance region and a negative resistance region forming a point of inflection, the slope of said negative resistance region being greater than that of said positive resistance region, means for biasing said device in said positive resistance region in the vicinity of said point of inflection, means for applying a pump voltage having a first frequency to said device, means for applying a signal voltage having a second frequency to said device whereby said device generates a voltage having a third frequency equal to the lower sideband of the second harmonic of said first frequency, said second frequency being approximately equal to but less than said first frequency, and said third frequency being approximately equal to but greater than said first frequency, first circuit means tuned to substantially said first, second and third frequencies coupled to said device, idler circuit means tuned to substantially a frequency equal to the difference between said first and second frequencies coupled to said device, and energy extracting means coupled to said first circuit means for providing an output voltage having a frequency equal to said third frequency.

5. A frequency down converter comprising, a non-linear negative conductance device having a current-voltage characteristic including a positive resistance region and a negative resistance region forming a point of inflection, the slope of said negative resistance region being greater than that of said positive resistance region, means for biasing said device in said positive resistance region in the vicinity of said point of inflection, means for applying a pump voltage having a frequency $f_p$ to said device, means for applying a signal voltage having a frequency $f_{12}$ slightly greater than said frequency $f_p$ to said device whereby said device generates a voltage having a frequency $f_s$ equal to the difference between the second harmonic of said frequency $f_p$ and said frequency $f_{12}$, said frequency $f_s$ being approximately equal to but less than said frequency $f_p$, and said frequency $f_{12}$ being approximately equal to but greater than said frequency $f_p$, first circuit means tuned to substantially said frequencies $f_p$, $f_{12}$ and $f_s$ coupled to said device, idler circuit means tuned to substantially a frequency equal to the difference between said frequencies $f_p$ and $f_s$ coupled to said device, and energy extracting means coupled to said first circuit means for providing an output voltage having a frequency equal to said frequency $f_s$.

6. A repeater comprising (a) first and second frequency converter stages, (b) each of said stages comprising a non-linear negative conductance device leaving a current-voltage characteristic including a positive resistance region and a negative resistance region forming a point of inflection, the slope of said negative resistance region being greater than that of said positive resistance region, (c) means for biasing said device in said positive resistance region in the vicinity of said point of inflection, (d) coupling mans for applying a pump voltage having a first frequency to said device, first circuit means tuned to substantially said first frequency, to substantially a second frequency approximately equal to but less than said first frequency and to substantially a third frequency equal to the lower sideband of the second harmonic of said first frequency and (e) idler circuit means tuned to a frequency equal to the difference between said first and second frequencies coupled to said device, (f) a common pump source producing a voltage at said first frequency coupled to each of the coupling means of said first and second stages, (g) means for applying a voltage having a frequency equal to that of said second frequency to said device of said first stage, (h) output means coupled to said device of said first stage for providing first and second voltages at said second and third frequencies, respectively, (i) means for applying said first and second voltages to said device of the said second stage and (j) output means coupled to said device of said second stage for providing at the output of said second stage one of said first and second voltages.

7. A repeater as set forth in claim 6 wherein each of said converter stages further includes (a) a circulator for passing voltages having said second and third frequencies and (b) wherein said coupling means includes a directional filter tuned to said first frequency.

References Cited by the Examiner

Chang et al., "Proceedings of the I.R.E.," May 1960, pp. 854–858.

ROY LAKE, *Primary Examiner.*

D. R. HOSTETTER, *Assistant Examiner.*